(12) United States Patent
Golan

(10) Patent No.: US 6,554,897 B2
(45) Date of Patent: *Apr. 29, 2003

(54) METHOD OF PRODUCING SILICON CARBIDE

(75) Inventor: Gady Golan, Hod Hasharon (IL)

(73) Assignee: Silbid Ltd., Tel-Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 09/734,543

(22) Filed: Dec. 13, 2000

(65) Prior Publication Data

US 2002/0144647 A1 Oct. 10, 2002

Related U.S. Application Data

(60) Provisional application No. 60/230,443, filed on Sep. 6, 2000.

(51) Int. Cl.[7] .............................................. C30B 29/36
(52) U.S. Cl. ........................ 117/109; 117/107; 117/952
(58) Field of Search ................................ 117/952, 107, 117/108

(56) References Cited

U.S. PATENT DOCUMENTS

| | | |
|---|---|---|
| 4,154,787 A | 5/1979 | Brown |
| 4,265,843 A | 5/1981 | Dias et al. |
| 4,650,776 A | 3/1987 | Cerceau et al. |
| 5,002,905 A | 3/1991 | Boecker et al. |
| 5,211,801 A | 5/1993 | Stein |
| 5,258,170 A | 11/1993 | Parent |
| 5,441,011 A | 8/1995 | Takahaski et al. |
| 5,922,300 A | 7/1999 | Nakajima et al. |
| 5,985,024 A | 11/1999 | Balakrishna et al. |
| 6,193,797 B1 | 2/2001 | Shiomi et al. |

FOREIGN PATENT DOCUMENTS

EP          322007         *   6/1989

* cited by examiner

Primary Examiner—Robert Kunemund
(74) Attorney, Agent, or Firm—G. E. Ehrlich L.

(57) ABSTRACT

A method of producing silicon carbide (SiC), by introducing into the interior of a furnace a quantity of relatively pure elemental silicon and a quantity of elemental carbon; subjecting the interior of the furnace to a vacuum; and heating the silicon and carbon to a temperature of 1500° C.–2200° C. to vaporize the silicon and to react it with the carbon to produce silicon carbide. Several embodiments are described for producing a heating or lighting element and a high temperature sensor, respectively, in which the carbon is in the form of a shaped body made of a mixture of finely-divided particles of carbon in a binder, and the silicon is in the form of finely-divided particles applied to the outer surface of the shaped body. A further embodiment is described for producing silicon carbide powder, in which the carbon and silicon are each in the form of finely-divided particles, and are physically separated from each other by a graphite sheet permeable to silicon vapor.

19 Claims, 4 Drawing Sheets

METHOD OF PRODUCING SILICON CARBIDE

RELATED APPLICATIONS

The present application is related to Provisional Application No. 60/230,443 filed Sep. 6, 2000, and claims the priority date of that application. The present application is also related to the following divisional applications concurrently filed herewith: (1) Ser. No. 09/734,544 for Method of Producing Silicon Carbide Heating and Lighting Elements; (2) Ser. No. 09/734,553 for Method of Producing Silicon Carbide High-Temperature Sensor Elements; and (3) Ser. No. 09/734,663 for Method of Producing Silicon Carbide Powder.

FIELD AND BACKGROUND OF THE INVENTION

The present invention relates to a method of producing silicon carbide (SiC). The method is particularly useful for producing silicon carbide heating and lighting elements, high-temperature sensor elements, and finely-divided particles of silicon carbide, (e.g., for use as abrasives, for hardening surfaces, etc.), and the invention is therefore particularly described below with respect to these applications. However, it will be appreciated from the description below that the novel method could also be used for producing silicon carbide for many other applications, such as semi-conductor substrates, hard coatings for turbine blades, high power switching devices, cosmic radiation protectors, etc.

Silicon carbide (SiC), sometimes referred to as carborundum, is a hard, clear, green-tinged or yellow-tinged crystalline compound, which is normally insulating but which becomes conductive when properly heated at a high temperature; for example, when heated to 2000° C., it is as conductive as graphite. This material, therefore, is frequently classified as a semiconductor. It is presently used in a wide variety of applications, including abrasives, heating elements, illuminating elements, high-temperature sensors and semiconductor substrates. Because of its highly unique properties, particularly hardness, heat resistance, semiconductivity, thermal and electrical stability, and corrosion resistance, it is commonly considered as the material of the future.

Silicon carbide is generally manufactured, according to one known method, by heating pure silica sand and carbon in the form of coke in an electrical furnace.

According to another known method, a graphite heating element in a cylinder bar is covered with mixture of carbon powder and quartz and high electrical current is passed through it to create a temperature of up to 3000° C. At this temperature, the quartz ($S_iO_2$) is broken down to pure silicon, which reacts with the carbon powder and creates the required SiC. At a lower temperature zone, a distance from the heater, the SiC begins crystallizing in the shape of small scales. These scales are ground to form a powder of the required size. This process of SiC powder synthesis which takes place in a vacuum ($10^{-3}$ Torr), requires in the order of 36 hours, as well as high electrical currents. Moreover, it is difficult to obtain a powder of the required grain size with this process.

Approximately 45 years ago a new concept was proposed by Lely for growing silicon carbide crystals of high quality; and approximately 20 years ago, a seeded sublimation growth technique was developed (sometimes referred to as the "modified Lely Technique". The latter technique lead to the possibility for true bulk crystal preparation.

However, these techniques are also relatively expensive and time-consuming, such that they impose serious limitations on the industrial potential of this remarkable material. In addition, silicon carbide heating or lighting elements prepared in accordance with these known techniques generally vary in resistance with temperature, and/or lose power with age, thereby requiring extra controls, special compensations, and/or frequent replacement.

OBJECTS AND BRIEF SUMMARY OF THE INVENTION

An object of the present invention is to provide a new method of producing silicon carbide having advantages in one or more of the above respects.

According to a broad aspect of the present invention, there is provided a method of producing silicon carbide (SiC), comprising: introducing into the interior of a furnace a graphite crucible containing a quantity of elemental silicon, and a quantity of elemental carbon free of water, at least the elemental silicon being in the form of finely-divided particles, the quantity of silicon being in excess of the quantity of carbon by weight; subjecting the interior of the furnace to a vacuum; and heating the silicon and carbon to a temperature of 1500° C.–2200° C. to vaporize the silicon and to convert the carbon to silicon carbide, the crucible being at least partly open at its upper end to the interior of the furnace to permit excess silicon vapors to escape and thereby avoid deposition of silicon on the outer surface of the silicon carbide.

Preferably, the carbon is either lignite carbon or anthracite carbon ground to a fine talc or power form.

During this heating process, the silicon vaporizes, diffuses into the carbon, and converts it to silicon carbide (SiC). Since silicon carbide has a green-tinged or yellow-tinged color, depending on impurities or dopants therein, the formation of such a color during the above-described heating process indicates that the resulting product is indeed silicon carbide.

Since the novel method utilizes elemental silicon, rather than $S_iO_2$ (as in sand, glass or quartz), it does not require the high temperatures (e.g., the order of 3000° C.), or the long heating time (e.g., the order of 36 hours) required on the prior art process as described above.

As will be described more particularly below, the method may be used in a wide variety of applications for producing shaped articles of silicon carbide, or for producing finely-divided particles of silicon carbide. Thus, the shaped articles of silicon carbide produced in accordance with the invention could be used for manufacturing heating elements, illuminating devices, high-temperature sensors, semiconductor substrates, and the like. The silicon carbide particles produced in accordance with the invention could be used as abrasives, for hardening surfaces such as turbine blades, and the like.

According to another aspect of the present invention, there is provided a method of producing a shaped article of silicon carbide (SiC), comprising: preparing a mixture of a quantity of carbon in the form of finely-divided particles mixed in a binder; shaping said mixture according to the desired shape of the article; applying finely-divided particles of silicon over the outer surface of said shaped article; introducing the shaped article with the finely-divided particles of silicon thereover into a graphite crucible, and introducing the crucible into the interior of a furnace; subjecting the interior of the furnace to a vacuum; and heating the interior of the furnace to a sufficiently high temperature and for a sufficiently long period of time until a resulting product is produced having a green-tinged or yellow-tinged color, the crucible being at least partly open at its upper end to the interior of the furnace to permit excess silicon vapors to escape and thereby avoid deposition of silicon on the outer surface of the silicon carbide.

In the preferred embodiments of the invention described below, the quantity of silicon is in excess of the quantity of carbon by weight to assure relatively complete conversion of the carbon to silicon carbide, with the excess silicon being removed by removing the silicon vapors during the diffusion process to prevent or minimize condensation of the silicon vapor on the outer surface of the silicon carbide.

Where heating or lighting elements are to be produced, the initial composition preferably includes relatively pure silicon but having traces of a dopant, such as zinc, aluminum, tellurium, or another element in the third or fifth column of the periodic table, in the ratio of about $1:10^{-6}$. The vacuum is preferably from $10^{-1}$ to $10^{-1}$ Torr, and the heating temperature is preferably 1550–1600° C. Such a process produces silicon carbon heating (or lighting) elements which are green-tinged in color, and have a relatively low internal resistance in the order of tens to a few hundreds of Ohm-cm.

On the other hand, where high-temperature sensors are to be produced, the initial composition preferably includes at least 10% more silicon than carbon, with the silicon being relatively free of dopants; and the heating is preferably effected at a vacuum of higher than $_{10}{}^{-1}$ Torr and at a temperature of about 1700–1800° C. in order to assure a Si:C ratio of 50:50 and to remove the extra silicon vapors. This technique produces high-temperature sensors having relatively high internal resistance, in the order of hundreds of Kilohm-cm, and a yellow-tinged color.

In some described preferred embodiments, the mixture is prepared by mixing the finely-divided particles of carbon in a water solution of sucrose, and in other described preferred embodiments, the mixture is prepared by mixing the finely-divided particles of carbon in polyvinyl acetate. In both cases, the carbon mixture is prebaked at about 500° C. in order to remove all water and to harden the sample. It will be appreciated, however, that other binders may be used.

According to yet another embodiment of the invention described below, the method produces finely-divided particles of silicon carbide (SiC), by: introducing into the furnace the silicon and carbon in the form of layers of finely-divided particles separated from each other by a layer permeable to silicon vapor.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
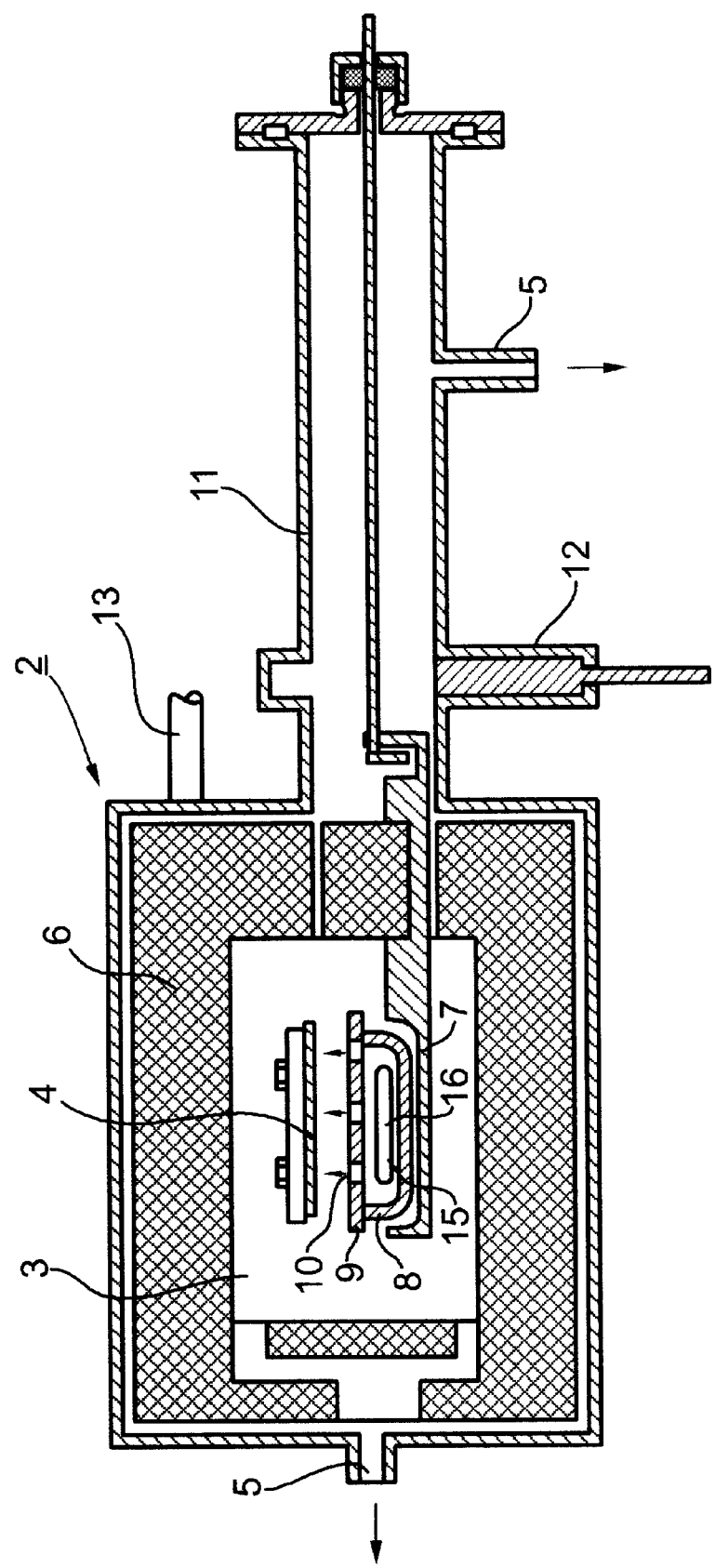
FIG. 1 diagrammatically illustrates one form of apparatus for use in preparing shaped silicon carbide articles in accordance with the method of the present invention.

Producing Shaped SiC Articles (FIG. 1)

FIG. 1 illustrates one form of apparatus for use in producing shaped articles of SiC, such as heating elements, lighting elements, high-temperature sensor elements, etc.

The apparatus illustrated in FIG. 1 includes a furnace, generally designated 2, whose interior 3 is heated by a plurality of planar electrical heating elements 4. A pump (not shown) communicates with the interior 3 of the furnace via gas outlets 5, for producing a vacuum therein. The interior of the furnace is lined with graphite walls 6 for heat isolation.

Disposed within the interior 3 of the furnace is a table 7 for supporting a crucible 8 to receive the work materials which, when subjected to heat and vacuum as described below, produce articles of silicon carbide. Crucible 8 is of hardened graphite. Its upper end is covered by a graphite lid 9 formed with openings 10 to provide communication between the interior of the crucible and the interior 3 of the furnace 2, as will be described more particularly below.

The work materials to be treated are introduced into the furnace via an insertion pipe 11. Pipe 11 includes the main gas outlet 5 connected to the vacuum pump (not shown), and also a vacuum valve 12. The furnace 2 further includes an electric feed-through 13 for supplying the electrical current to the heating elements.

Such electrical furnaces are well known, and therefore further details of its structure and the manner of operating it are not set forth herein.

In the examples to be described below, the shaped workpiece of silicon carbide to be produced is a rod, wire or electrode, to be used in the manufacture of electrical resistor elements, light source elements, or high-temperature sensor elements. FIG. 1 illustrates the workpiece, therein generally designated 15, of the desired shape disposed within the crucible 8. This workpiece is prepared from a mixture of carbon in the form of finely-divided particles mixed in a binder to produce a doughy mixture which can be shaped as desired, in this case according to a rod, wire or electrode. Preferably, the carbon is either lignite carbon or anthracite carbon ground to a fine talc or power form. The carbon-binder mixture is pre-baked in order to harden the workpiece.

Finely-divided particles of relatively-pure elemental silicon 16 (as distinguished from silicon dioxide, as in, e.g., sand or quartz) are applied over the complete outer surface of the shaped workpiece 15 before the latter is placed in the crucible 8. The crucible is then covered by the lid 9 and placed on table 7 in the interior of the furnace.

The interior of the furnace, with the crucible 8 and workpiece 15 therein, is subjected to a vacuum via gas outlets 5, and is heated by electrical heating elements 4. This heating of the interior of the furnace 3 is at a sufficiently high temperature, and for a sufficiently long period of time, to vaporize the silicon and to cause its vapors to diffuse and to react with the carbon to produce silicon carbide. Thus, the heating may be continued until the workpiece 15 exhibits a green-tinged or a yellow-tinged color, thereby indicating that the silicon particles 16 applied over the carbon-containing body 15 have converted the carbon to silicon carbide.

Crucible lid 9 is provided with the openings 10 to permit the silicon vapors to escape during the heating process into the interior 3 of the furnace. This prevents or reduces the condensation and deposition of silicon on the outer surface of the workpiece 15. If such a deposition is produced, it can be removed by a suitable silicon etchants.

Following are several examples for producing silicon carbide heating and lighting elements:

EXAMPLE 1

In this example, the carbon particles used for making the shaped workpiece 15 are finely-divided particles of charcoal having a particle size of 50–250 microns; and the silicon particles 16 applied over the shaped workpiece 15 are finely-divided particles of the waste of silicon wafers, both the mono-crystalline and the poly-crystalline type, resulting from the production of semiconductor devices, also ground to a fine particle size.

The initial composition preferably includes 54% silicon and 46% carbon by weight, with the silicon being relatively pure but including traces of dopants, such as zinc, aluminum, and/or tellurium, in the ratio of about $1:10^{-6}$. Such dopants reduce the internal resistance of the produced silicon carbide composition.

The carbon particles are mixed in a binder of white sugar (sucrose) dissolved in soft water (one kilogram of white sugar with a few liters of water), which water was subsequently evaporated. The carbon particles are homogeneously mixed in the sugar solution by means of a blender, pre-baked at about 500° C. to remove the water and to harden the workpiece to a doughy consistency, and then shaped to the desired configuration (e.g., a rod).

The shaped workpiece 15 (consisting of carbon particles in the binder) is covered by finely-divided particles of the silicon powder 16, and is then placed within the crucible 8 and covered by the lid 8. The interior of the oven 3 is then evacuated to a pressure of $10^{-3}$ Torr and heated to a temperature of 1550° C.–1600° C. for a period of 45 minutes. During this period, the silicon powder 16 vaporizes and diffuses into the carbon of the workpiece 15, converting it to silicon carbide. This is manifested by a green-tinged color.

Upon completion of the heating process, the workpiece is retained in the oven for a period of approximately 3-hours after the heating elements have been de-energized, to permit a gradual cooling of the workpiece in an annealing process. The workpiece may then be removed from the oven.

The so-produced material was used for making wire elements of 0.3 mm diameter, wound into a wire helix of 2 mm diameter, having a length of 400 mm. The 400 mm wire reached the maximum temperature of 1600° C. in less than 3-seconds after switching to 220 volts; the current consumption was 9A.

The so-produced material was also used to make thin round elements of 1 cm in length and 4 mm in diameter. Such elements reached the maximum temperature of 1600° C. in less than 3-seconds after switching to 60 V, with current consumption of 10 A.

The so-produced material was also used to make round elements 12 cm in length and 10 mm in diameter. Such elements reached the maximum temperature of 1600° C. in less than 3-seconds after switching to 60 V. They were left to operate continuously for 16 hours and had a current consumption of 30A.

The ohmic resistance of all the foregoing elements remained substantially the same after 16 hours of operation.

Figure 3:
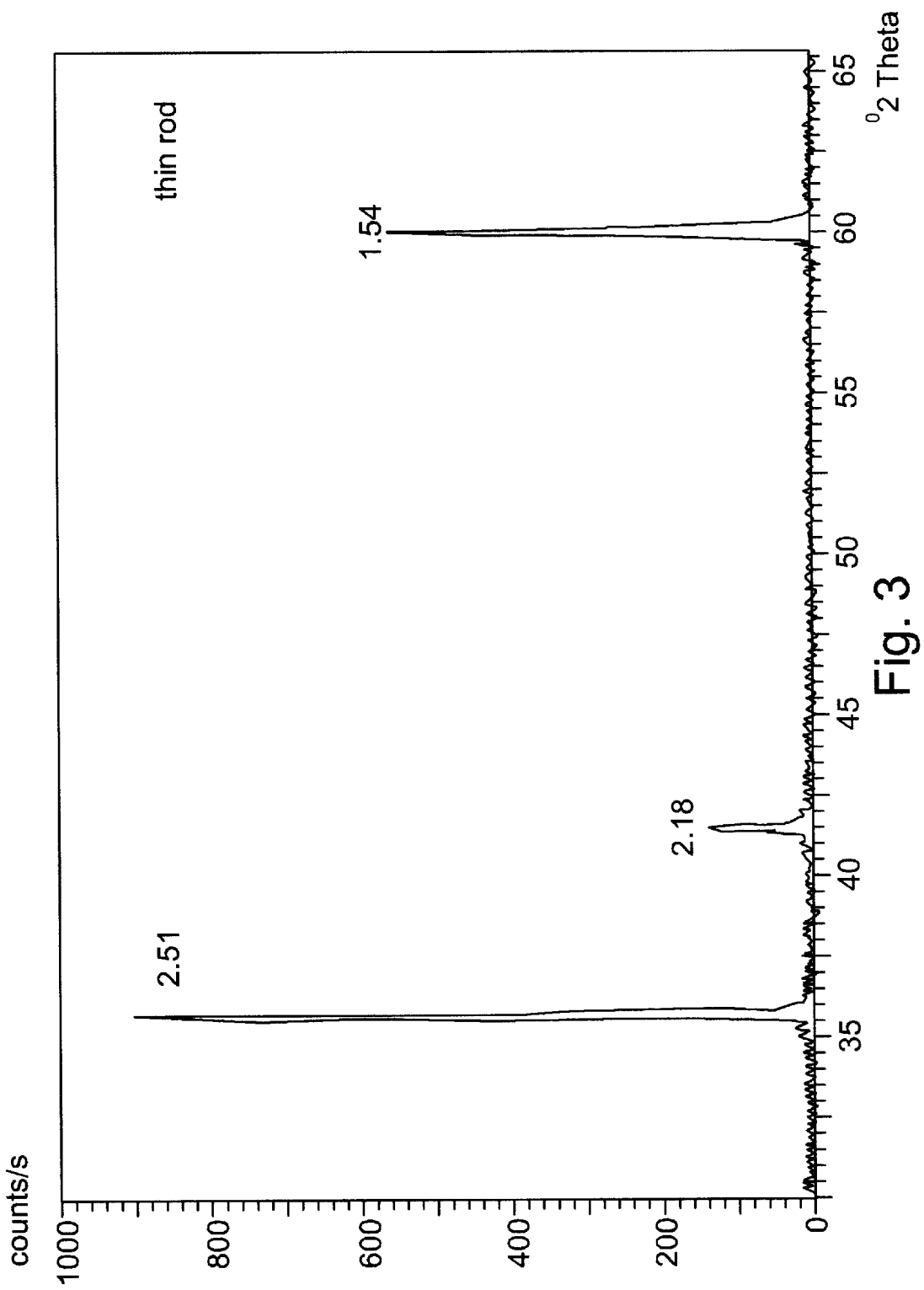
FIGS. 3 and 4 are results of X-ray diffraction tests performed on the materials produced according to the described method.
Figure 4:
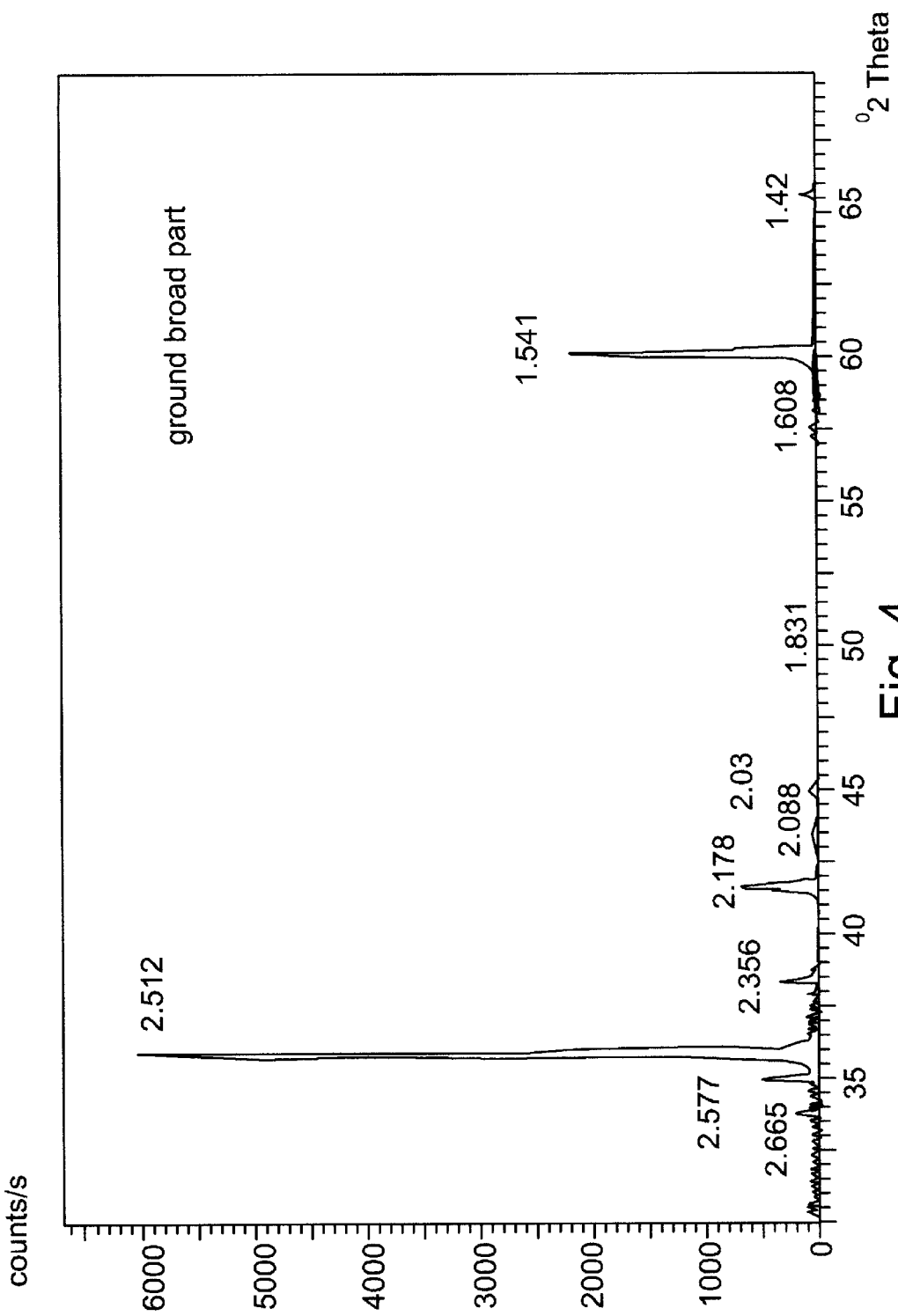

Two samples of the fabricated SiC elements, one in the form of a thin rod and the other in the form of ground particles, were sent for X-ray diffraction measurements in order to verify their structure. The obtained results appear in FIG. 3 (thin rod) and FIG. 4 (ground particles) which clearly show that the produced material is indeed SiC according to the obtained peaks.

The following two tables further confirm that the produced product was SiC, Table 1 being a diffractometer analysis of the thin rod produced according to the above example, and Table 2 being a diffractometer analysis of Sic.

TABLE 1

| | | |
|---|---|---|
| X'Pert Graphics & Identify | | yoetz |
| (searched) peak list: thin rod | | 01-Nov-00 14:41 |
| Original scan: thin rod | Date: 01-Nov-00 14:17 | |
| Description of scan: | | |
| Used wavelength: | K-Alpha1 | |
| K-Alpha1 wavelength (Å): | 1.54056 | |
| K-Alpha2 wavelength (Å): | 1.54439 | |
| K-Alpha2/K-Alpha1 intensity ratio: | 0.50000 | |
| K-Alpha wavelength (Å): | 1.54056 | |
| K-Beta wavelength (Å): | 1.39222 | |
| Peak search parameter set: | As Measured Intensities | |
| Set created: | 16-Jan-00 09:57 | |
| Peak positions defined by: | Top of smoothed peak | |
| Minimum peak tip width (°2Theta): | 0.10 | |
| Minimum peak tip width (°2Theta): | 1.00 | |
| Peak base width (°2Theta): | 2.00 | |
| Minimum significance: | 1.00 | |

| d-spacing (Å) | Relative Intensity (%) | Angle (°2Theta) | Peak Height (counts/s) | Background (counts/s) | Tip Width (°2Theta) | Significance |
|---|---|---|---|---|---|---|
| 2.51426 | 100.00 | 35.68055 | 920.51 | 4.32 | 0.14000 | 5.41 |
| 2.17815 | 14.46 | 41.42016 | 133.12 | 2.38 | 0.24000 | 6.10 |
| 1.91302 | 0.72 | 47.48813 | 6.63 | 1.32 | 0.12000 | 1.05 |
| 1.54071 | 61.00 | 59.99353 | 561.50 | 3.82 | 0.12000 | 3.29 |

TABLE 2

| d | 2.52 | 1.54 | 1.31 | 2.52 | (SIC)8E | | | ★ |
|---|------|------|------|------|---------|---|---|---|
| I/I₁ | 100 | 35 | 25 | 100 | Silicon Carbide | | | |

| | d Å | I/I₁ | hκl | d Å | I/I₁ | hκl |
|---|-----|------|-----|-----|------|-----|
| Rad. CuKα Å 1.54178 Filter Mono. Dia. | 2.520 | 100 | 111 | | | |
| Cutoff   I/I₁ Diffractometer   I/I cor. | 2.180 | 20 | 200 | | | |
| Ref. Bind, J., Penn State University (1977) | 1.5411 | 35 | 220 | | | |
| | 1.3140 | 25 | 311 | | | |
| Sys. Cubic      S.G.  ρ43m (216) | 1.2583 | 5 | | 222 | | |
| a₀  4.3589 b₀    c₀    Å    C | 1.0893 | 5 | | 400 | | |
| α     β      γ      Z   4   Dx   3.215 | 0.9999 | 10 | | 331 | | |
| Ref. Ibid. | v 82.819Å³ | .9748 | 5 | | 420 | |
| | | .8895 | 5 | | 422 | |
| cα     n ω β      c γ      Si μ | .8387 | 5 | | 511.333 | | |
| 2V     D    mp    Color Yellow-Olive | | | | | | |

Ref. Ibid.
Specimen from PPG Industries, Inc., Submicron SIC -
lot no. 373-652.
Zinc Sulfide structure type.
3C polytype.
To replace 1-1119.
Sl used as internal standard (a₀ = 5.43088Å).

EXAMPLE 2

This example was the same as in Example 1, except that the finely-divided particles of carbon are mixed in a binder of polyvinyl acetate, in an amount of 0.5 kg polyvinyl acetate to one kg. of carbon, instead of the sugar solution. The process is otherwise the same as in Example 1.

EXAMPLE 3

This example is also the same as in Example 1, except that the sample is heated to a higher temperature of 1800° C. for a shorter period of time, 30 minutes. The rest of the procedure is substantially the same as in Example 1.

EXAMPLE 4

This example is also the same as Example 1, except that the sample is heated to an even higher temperature, 2200° C., for an even shorter period of time, 15 minutes. The remainder of the procedure is the same as in Example 1.

Silicon carbide heating elements and lighting elements can thus be made according to the foregoing examples to have some or all of the following advantages: stable thermal and electrical performance over time and numerous heating operations; vibration and shock proof while heating; operable in an open air environment without oxidizing and without releasing poisonous gasses; capable of operating in corrosive and aggressive conditions without degradation in performance; capable of varying the temperature almost linearly with voltage up to 1600° C.; lower manufacturing cost compared to conventional SiC elements; easily structured in various sizes and shapes (variable wattage); and extremely radiation hard and therefore protective against nuclear radiation;

Following are several examples for producing silicon carbide high-temperature sensor elements:

EXAMPLE 5

In this example, the carbon particles used for making the shaped workpiece 15 are finely-divided particles of charcoal having a particle size of 50–250 microns; and the silicon particles 11 applied over the shaped workpiece 15 are finely-divided particles of the waste of silicon wafers, both the mono-crystalline and the poly-crystalline type, resulting from the production of semiconductor devices, also ground to a fine particle size. The silicon component, however, is relatively free of dopants and impurities in order to obtain a high internal resistance in the produced sensor element. In addition, the quantity of the silicon should exceed by at least 10% the quantity of the carbon by weight, in order to provide an excess of silicon vapor during the heating process, as described more particularly below.

The carbon particles are mixed in a binder of white sugar (sucrose) dissolved in soft water (one kilogram of white sugar with a few liters of water), and homogeneously mixed by means of a blender. The mixture is pre-baked at 500° C. to harden it to a doughy consistency, and then shaped to the desired configuration (e.g., a rod).

The shaped workpiece 15 (consisting of carbon particles in the binder) is covered by finely-divided particles of the silicon powder 16, and is then placed within the crucible 8 and covered by the lid 8. The interior of the oven 3 is evacuated to a pressure higher than $10^{-4}$ Torr and heated to a temperature of 1700° C.–1800° C. for a period of 30 minutes. During this period, the silicon powder 16 vaporizes and diffuses into the carbon of the workpiece 15, converting it to silicon carbide. This is manifested by a yellow-tinged color.

Upon completion of the heating process, the workpiece is retained in the oven for a period of approximately 3-hours after the heating elements have been de-energized, to permit a gradual cooling of the workpiece in an annealing. The workpiece was then removed from the oven.

Since the vapor pressure of silicon is higher than that of carbon, the relatively high heating temperature (1700° C.–1800° C.), and the relatively high vacuum, (higher than $10^{-4}$ Torr) cause the excess silicon to evaporate until the required equal amounts of 50/50 of silicon:carbon is obtained. In addition, the use of silicon free of dopants and impurities in the initial material produces a silicon carbide body of high internal resistance, in the order of hundreds of Kilohm-cms and higher.

EXAMPLE 6

This example is the same as Example 5, except that the finely-divided particles of carbon are mixed in a binder of polyvinyl acetate, in an amount of 0.5 kg of polyvinyl acetate to one kg. of carbon, instead of the sugar solution. The process is otherwise the same as in Example 4.

EXAMPLE 7

This example is also the same as Example 5, except that the sample is heated to an even higher temperature of 2200° C. in the furnace for a period of about 15 minutes, rather than a temperature of 1700° C.–1800° C. for 30 minutes as in Example 5. The remainder of the procedure is otherwise the same as in Example 5.

Figure 2:
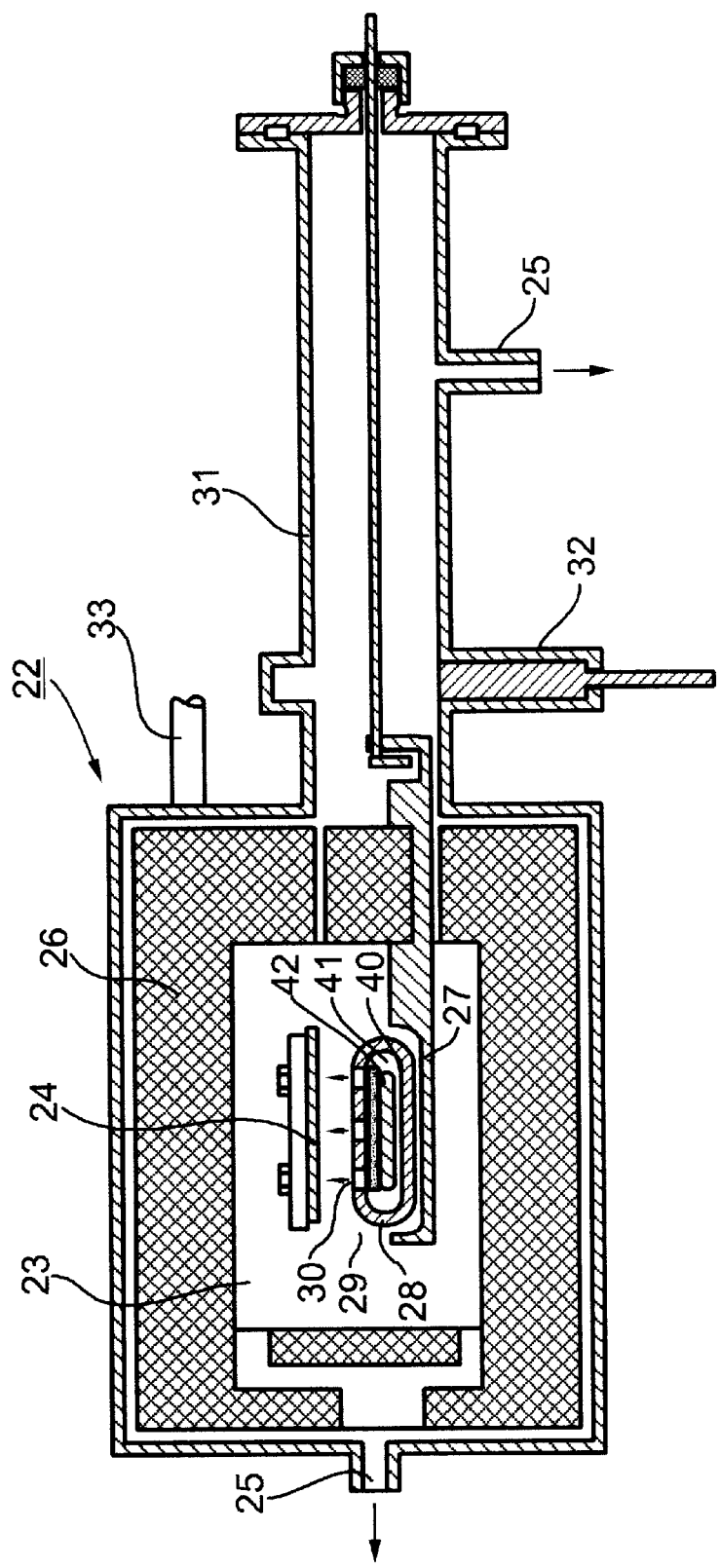
FIG. 2 diagrammatically illustrates one form of apparatus for use in preparing silicon carbide powder in accordance with the method of the present invention.

Silicon carbide high-temperature sensor elements can thus be made according to the foregoing examples to have some or all of the following advantages: stable thermal and electrical performance over time and numerous operations; vibration and shock proof; operable in an open air environment without oxidizing and without releasing poisonous gasses; capable of operation in corrosive and aggressive conditions without degradation in performance; lower manufacturing cost compared to conventional SiC elements; easily structured in various sizes and shapes; and extremely radiation hard and therefore protective against nuclear radiation;

Preparation of Silicon Carbide Powder (FIG. 2)

FIG. 2 illustrates apparatus for producing silicon carbide powder, for example in preparing abrasives, hardened surfaces of cutting tools, hardened surface of turbine blades, etc.

The apparatus illustrated in FIG. 2 includes a furnace, generally designated 22, whose interior 23 is heated by a plurality of planar electrical heating elements 24. A pump (not shown) communicates with the interior 23 of the furnace via gas outlets 25, for producing a vacuum therein. The interior of the furnace is lined with graphite walls 26 for heat isolation.

Disposed within the interior 23 of the furnace is a table 27 for supporting a crucible 28 to receive the work materials which, when subjected to heat and vacuum as described below, produce silicon carbide powder. Crucible 28 is of hardened graphite. Its upper end is covered by a graphite lid 29 formed with openings 30 to provide communication between the interior of the crucible and the interior 23 of the furnace 22, as will be described more particularly below.

The work materials to be processed are introduced into the furnace via an insertion pipe 31. Pipe 31 includes the main gas outlet 25 connected to the vacuum pump, and also a vacuum valve 32. The furnace 22 further includes an electric feed-through 33 for supplying the electrical current to the heating elements.

Such electrical furnaces are well known, and therefore further details of its structure and the manner of operating it are not set forth herein.

Crucible 28 includes the silicon component in the form of finely-divided particles 40 placed at the bottom of the crucible. The carbon component is in the form of finely-divided particles shown at 41, separated from the silicon particles 40 by a layer 42 which is permeable to the silicon vapors produced during the heating process, to enable such vapors to rise and react with the carbon particles 40 to produce the silicon carbide particles. Preferably, the carbon is either lignite carbon or anthracite carbon ground to a fine talc or power form. Layer 42 is preferably a hardened graphite cloth placed on the silicon particles with the carbon particles on the graphite cloth, such that the silicon vapors penetrate and diffuse with respect to the carbon particles to convert them to SiC.

The interior of the furnace 22, with the crucible 28 and the silicon particles 40, carbon particles 41, and permeable graphite cloth layer 42 therein, is subjected to a vacuum via gas outlets 25, and is heated by electrical heating elements 24. This heating of the interior of the furnace 23 is at a sufficiently high temperature, and for a sufficiently long period of time, until the particles within the crucible exhibit a green-tinged or yellow-tinged color, thereby indicating that the silicon particles 40 have vaporized, diffused into the carbon particles, and have converted the carbon particles to silicon carbide particles.

As indicated earlier, crucible lid 29 is provided with openings 30. This permits the silicon vapors to escape during the heating process into the interior 23 of the furnace, and thereby prevents or reduces the condensation and deposition of silicon vapors on the outer surface of the carbon particles.

Following are several examples for producing silicon carbide particles or powder using the apparatus of FIG. 2;

EXAMPLE 8

In this example, the carbon particles 41 are finely-divided particles of charcoal having a particle size of 50–250 microns; and the silicon particles 40 introduced in the bottom of the crucible 28 are finely-divided particles of relatively pure silicon obtained from the waste of silicon semiconductor wafers, both the mono-crystalline and the poly-crystalline type, resulting from the production of semiconductor devices and ground to a fine particle size. This example used a 10% excess of silicon particles by weight over the carbon particles, namely 1.0 kilogram of carbon particles and 1.10 kilogram of silicon particles. The silicon is relatively pure elemental silicon but may include traces of dopants or impurities as present in silicon semiconductor wafers.

The interior of the oven 23 is evacuated to a pressure of $10^{-3}$ Torr and heated to a temperature of 1550° C.–1600° C. for a period of 30 minutes. During this period, the silicon particles 40 vaporize, diffuse through the graphite layer 42 and convert the carbon particles to silicon carbide powder which is manifested by a green-tinged or yellow-tinged color.

Upon completion of the heating process, the workpiece is retained in the oven for a period of approximately 3-hours after the heating elements have been de-energized, to permit a gradual cooling of the sample in an annealing process. The workpiece may then be removed from the oven.

EXAMPLE 9

This example is the same as in Example 8, except that the sample is heated to a higher temperature of 1600° C. for 45 minutes, rather than a temperature of 1800° C. for 30 minutes. The rest of the procedure is substantially the same as in Example 8.

EXAMPLE 10

This example is also the same as Example 8, except that the sample is heated to a temperature of 2200° C. in the furnace for a period of about 15 minutes, rather than a temperature of 1800° C. for 30 minutes as in Example 8. The remainder of the procedure is the same as in Example 8.

EXAMPLE 11

According to a modification of Example 8, the carbon particles may be placed in the bottom of the crucible, and the silicon particles placed thereover, without the graphite sheet, to first liquify the silicon to wet the carbon particles, and then to vaporize the silicon and to react the vapor with the carbon particles, to produce the SiC particles. The remainder of the procedure may be according to any of Examples 7–10.

While the invention has been described with respect to several preferred examples, it will be appreciated that these are set forth merely for purposes of illustrating the invention, and that many other variations, modifications and applications of the invention may be made.

What is claimed is:

1. A method of producing silicon carbide (SiC), comprising:

introducing into the interior of a furnace a graphite crucible containing a quantity of elemental silicon, and a quantity of elemental carbon free of water, at least the elemental silicon being in the form of finely-divided particles, the quantity of silicon being in excess of the quantity of carbon by weight;

subjecting the interior of the furnace to a vacuum;

and heating the silicon and carbon to a temperature of 1500° C.–2200° C. to vaporize the silicon and to convert the carbon to silicon carbide, said crucible being at least partly open at its upper end to the interior of the furnace to permit excess silicon vapors to escape and thereby avoid deposition of silicon on the outer surface of the silicon carbide.

2. The method according to claim 1, wherein said silicon is relatively pure except for possible traces of impurities or dopants.

3. The method according to claim 1, wherein the quantity of silicon by weight is in excess of the quantity of carbon, and the excess silicon is removed by removing excess silicon vapors.

4. The method according to claim 1, wherein said carbon is in the form of a body of finely-divided particles of carbon in a water-free binder, and said silicon is in the form of finely-divided particles of silicon applied to the outer surface of said mixture.

5. The method according to claim 4, wherein said mixture is shaped according to a desired configuration, before the finely-divided particles of silicon are applied to its outer surface.

6. The method according to claim 4, wherein said carbon body is prepared by mixing said finely-divided particles of carbon in a water solution of sucrose, and pre-baking said mixture at a sufficiently high temperature to remove said water.

7. The method according to claim 4, wherein said carbon body is prepared by mixing said finely-divided particles of carbon in polyvinyl acetate and pre-baking said mixture.

8. The method according to claim 1, wherein said carbon is in the form of a layer of finely-divided particles, and said silicon is in the form of a layer of finely-divided particles separated from said layer of finely-divided particles of carbon by a layer permeable to silicon vapor.

9. The method according to claim 8, wherein said silicon-vapor permeable layer is a sheet of graphite.

10. The method according to claim 1, wherein the resulting product, after being heated, is gradually cooled to room temperature over a period of time substantially longer than the heating time, before the resulting product is removed from the furnace.

11. Silicon carbide produced according to the method of claim 1.

12. A method of producing a shaped article of silicon carbide (SiC), comprising:

preparing a mixture of a quantity of carbon in the form of finely-divided particles mixed in a binder;

shaping said mixture according to the desired shape of the article;

applying finely-divided particles of silicon over the outer surface of said shaped article;

introducing said shaped article with the finely-divided particles of silicon thereover into a graphite crucible, and introducing said crucible into the interior of a furnace;

subjecting the interior of the furnace to a vacuum;

and heating the interior of the furnace to a sufficiently high temperature and for a sufficiently long period of time until a resulting product is produced having a green-tinged or yellow-tinged color, said crucible being at least partly open at its upper end to the interior of the furnace to permit excess silicon vapors to escape and thereby avoid deposition of silicon on the outer surface of the silicon carbide.

13. The method according to claim 12, wherein the silicon is relatively pure elemental silicon except for possible traces of impurities or dopants.

14. The method according to claim 12, wherein the interior of said furnace, when subjected to said vacuum, is heated to a temperature of 1500° C.–2200° C.

15. The method according to claim 12, wherein the quantity of silicon by weight is in excess of the quantity of carbon, and the excess silicon is removed by removing excess silicon vapors.

16. The method according to claim 13, wherein said mixture is prepared by mixing said finely-divided particles of carbon in a water solution of sucrose, and pre-baking said mixture at a high temperature to remove the water and to harden the mixture.

17. The method according to claim 12, wherein said mixture is prepared by mixing said finely-divided particles of carbon in polyvinyl acetate and pre-baking said mixture.

18. The method according to claim 12, wherein the resulting product, after being heated, is gradually cooled to room temperature over a period of time substantially longer than the heating time, before the resulting product is removed from the furnace.

19. The method according to claim 12, wherein said mixture is shaped into the shape of a wire, bar or wafer before the finely-divided particles of silicon are applied over its outer surface.

* * * * *